(12) United States Patent
Ptasienski et al.

(10) Patent No.: US 11,382,180 B2
(45) Date of Patent: Jul. 5, 2022

(54) MULTI-ZONE PEDESTAL HEATER HAVING A ROUTING LAYER

(71) Applicant: Watlow Electric Manufacturing Company, St. Louis, MO (US)

(72) Inventors: Kevin Ptasienski, O'Fallon, MO (US); Stanton Hopkins Breitlow, Winona, MN (US); Mohammad Nosrati, Redwood City, CA (US); Kevin Smith, Columbia, MO (US); Brittany Phillips, Saint Louis, MO (US); Ken Ames, San Jose, CA (US); Patrick Margavio, Columbia, MO (US); Kurt English, Columbia, MO (US)

(73) Assignee: WATLOW ELECTRIC MANUFACTURING COMPANY, St. Louis, MO (US)

( * ) Notice: Subject to any disclaimer, the term of this patent is extended or adjusted under 35 U.S.C. 154(b) by 585 days.

(21) Appl. No.: 16/196,699

(22) Filed: Nov. 20, 2018

(65) Prior Publication Data

US 2019/0159291 A1    May 23, 2019

Related U.S. Application Data

(60) Provisional application No. 62/589,023, filed on Nov. 21, 2017.

(51) Int. Cl.
*H05B 3/06* (2006.01)
*H05B 3/28* (2006.01)
(Continued)

(52) U.S. Cl.
CPC ............ *H05B 3/06* (2013.01); *C23C 16/4586* (2013.01); *H01L 21/67103* (2013.01);
(Continued)

(58) Field of Classification Search
CPC .......... H05B 3/06; H05B 3/28; H05B 1/0202; H05B 1/0233; H05B 2203/005;
(Continued)

(56) References Cited

U.S. PATENT DOCUMENTS

| 6,066,836 A | 5/2000 | Chen et al. |
| 6,617,553 B2 | 9/2003 | Ho et al. |

(Continued)

FOREIGN PATENT DOCUMENTS

| JP | H10189490 | 7/1998 |
| JP | 2010040422 | 2/2010 |

(Continued)

OTHER PUBLICATIONS

International Search Report for International application PCT/US2018/062036, dated Feb. 14, 2019.

*Primary Examiner* — Shawntina T Fuqua
(74) *Attorney, Agent, or Firm* — Burris Law, PLLC

(57) ABSTRACT

The present disclosure provides a support pedestal that includes a support member including a resistive layer having at least two zones, a routing layer, and a plurality of conductive vias. The resistive layer and the routing layer are disposed in different planes of the support member and are connected by the plurality of vias. The number of zones of the resistive layer is greater than or equal to a number of wires coupled to the routing layer. The routing layer may include a plurality of arm portions that extend from a central region of the routing layer. The support pedestal may further include a second resistive layer disposed along the same plane as the routing layer.

20 Claims, 19 Drawing Sheets

(51) Int. Cl.
*H05B 1/02* (2006.01)
*H01L 21/67* (2006.01)
*H01L 23/522* (2006.01)
*H01L 23/485* (2006.01)
*C23C 16/458* (2006.01)
*H01L 21/687* (2006.01)

(52) U.S. Cl.
CPC .. *H01L 21/67109* (2013.01); *H01L 21/67248* (2013.01); *H01L 21/68735* (2013.01); *H01L 21/68757* (2013.01); *H01L 23/485* (2013.01); *H01L 23/522* (2013.01); *H05B 1/0202* (2013.01); *H05B 1/0233* (2013.01); *H05B 3/28* (2013.01); *H05B 2203/005* (2013.01); *H05B 2203/007* (2013.01); *H05B 2203/014* (2013.01); *H05B 2203/016* (2013.01); *H05B 2203/035* (2013.01)

(58) Field of Classification Search
CPC ........ H05B 2203/007; H05B 2203/014; H05B 2203/016; H05B 2203/035; C23C 15/4586; H01L 21/67103; H01L 21/67109; H01L 21/67248; H01L 21/68735; H01L 21/68757; H01L 21/68785; H01L 23/485; H01L 23/522
See application file for complete search history.

(56) References Cited

U.S. PATENT DOCUMENTS

| | | | |
|---|---|---|---|
| 6,646,235 | B2 | 11/2003 | Chen et al. |
| 7,176,420 | B2 | 2/2007 | Abbott et al. |
| 7,196,295 | B2 | 3/2007 | Fennewald et al. |
| 7,257,464 | B2 | 8/2007 | Fennewald et al. |
| 7,279,661 | B2 | 10/2007 | Okajima et al. |
| 7,560,367 | B2 | 7/2009 | Kawase et al. |
| 8,423,193 | B2 | 4/2013 | Fennewald et al. |
| 9,123,755 | B2 | 9/2015 | Swanson et al. |
| 9,538,583 | B2 | 1/2017 | Volfovski et al. |
| 10,256,105 | B2 | 4/2019 | Takebayashi et al. |
| 10,340,162 | B2 | 7/2019 | Swanson et al. |
| 2002/0092471 | A1 | 7/2002 | Kang et al. |
| 2004/0188413 | A1* | 9/2004 | Natsuhara ............ H05B 3/143 219/444.1 |
| 2009/0314762 | A1 | 12/2009 | Cui et al. |
| 2010/0193501 | A1 | 8/2010 | Zucker et al. |
| 2013/0284721 | A1* | 10/2013 | Yang .................... H05B 3/12 219/553 |

FOREIGN PATENT DOCUMENTS

| | | |
|---|---|---|
| WO | 2012141722 | 10/2012 |
| WO | 2017074838 | 5/2017 |

* cited by examiner

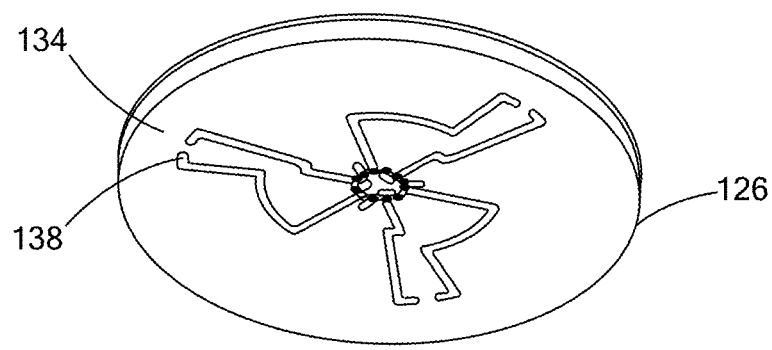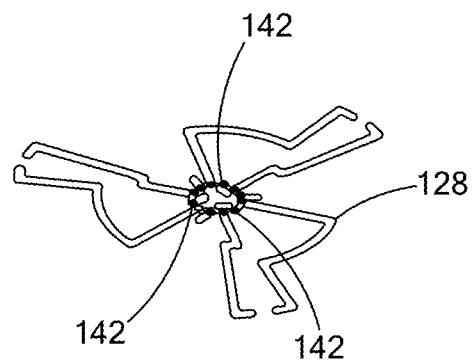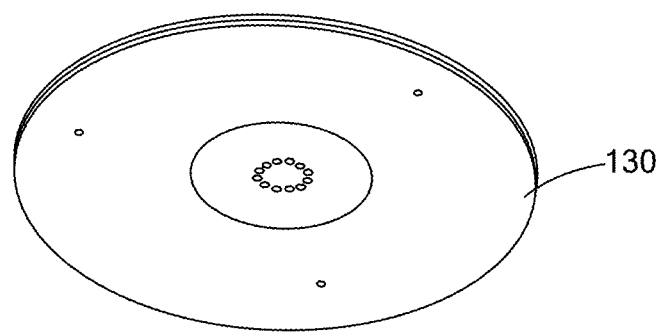
FIG. 20

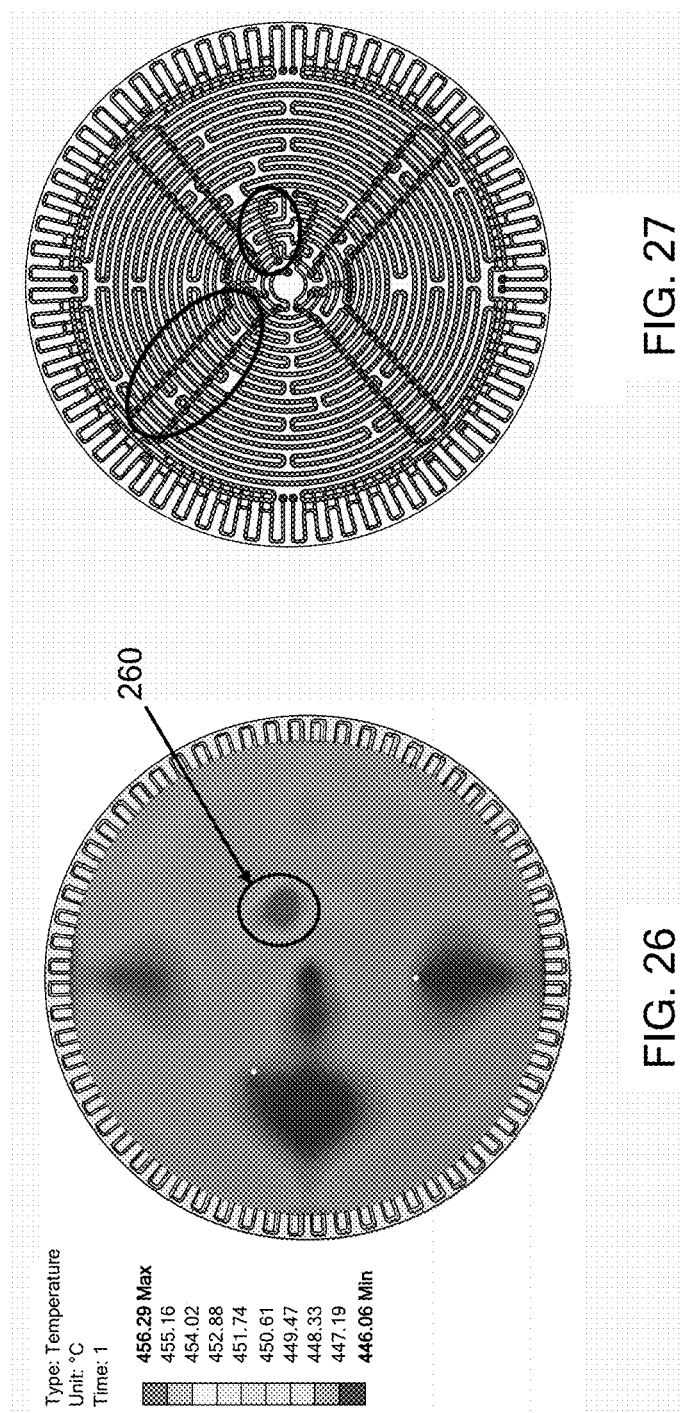

MULTI-ZONE PEDESTAL HEATER HAVING A ROUTING LAYER

CROSS-REFERENCE TO RELATED APPLICATIONS

This application claims priority to and the benefit of U.S. Provisional Application No. 62/589,023, titled "Multi-Zone Ceramic Pedestal" filed Nov. 21, 2017, the contents of which are incorporated herein by reference in their entirety.

FIELD

The present disclosure relates generally to semiconductor processing apparatuses, and more particularly to substrate support pedestals for supporting and heating a substrate, such as a wafer, thereon.

BACKGROUND

The statements in this section merely provide background information related to the present disclosure and may not constitute prior art.

A wafer support assembly such as a pedestal for semiconductor processing is disposed in a semiconductor processing chamber and typically includes a wafer support portion and a shaft secured to a central region of the wafer support portion. The wafer support portion may include a resistive heating element for generating heat and electric terminations for connecting the resistive heating element to an external power source. The electric terminations are disposed adjacent to the central region of the wafer support portion and extend in the shaft. The resistive heating element is disposed outside the central region of the wafer support portion, and usually, at proximity of the center shaft area there are no resistive heating elements due to the presence of the electric terminations. As a result, a cold spot is typically generated in the central region, and the size of the central region is thus made relatively small in order to reduce the area of the cold spot.

The reduced size of the central region, however, limits the number of electric terminations that can be disposed in the central regions and consequently the number of the heating zones that can be independently controlled. Due to complexity of integrating temperature sensing devices in to a pedestal and cold region at proximity of shaft area, a conventional wafer support pedestal is generally configured to provide only one or two heating zones. With limited heating zones, a predetermined heating profile across the wafer support portion cannot be provided due to various factors that may be present in a semiconductor processing chamber to affect a local temperature of the wafer support portion.

Moreover, the reduced size of the central region also limits the number of temperature sensors that can be used to monitor the temperature of the wafer support portion. The limited number of temperature sensors does not allow for precise monitoring of the temperature of the wafer support portion. Therefore, the resistive heating element of the wafer support portion is typically operated using ratio control (i.e., open loop).

SUMMARY

The present disclosure provides a support pedestal that includes a support member including a resistive layer having at least two zones, a routing layer, and a plurality of conductive vias. The resistive layer and the routing layer are disposed in different planes of the support member and are connected by the plurality of vias. The number of zones of the resistive layer is greater than or equal to a number of wires coupled to the routing layer.

In one form, the resistive layer and the routing layer are disposed in a plane normal to the support member and overlap such that the resistive layer extends across a central region of the support member.

In another form, support member includes a main substrate having opposing surfaces. The resistive layer and the routing layer are disposed on the opposing surfaces of the main substrate, and the plurality of conductive vias extend through the main substrate. In this form, the plurality of conductive vias may be disposed perpendicular to the opposing surfaces.

In another form, the resistive layer includes a plurality of resistive heating elements that define a plurality of heating zones and the routing layer includes a central portion and a plurality of arm portions extending from the central portion. The plurality of arm portions are electrically connected to the heating zones and the number of arm portions corresponds to the number of the resistive heating elements. The support member may further include a plurality of electric terminals connected to the central portion of the routing layer.

In yet another form, the support member includes a main substrate defining a top surface and a bottom surface. The main substrate further defines a plurality of via apertures for receiving the conductive vias therein, and a plurality of blind recesses open to the bottom surface. The plurality of via apertures may extend from the top surface to the bottom surface of the main substrate and are flush with the top and bottom surfaces of the main substrate. In addition, electric terminals may be provided that are inserted into the blind recesses. The routing layer may include a plurality of arm portions, each arm portion having one end connected to a pair of the conductive vias and another end connected to a pair of electric terminals. The electric terminal may be flush with the bottom surface of the main substrate.

In still another form, the support member further includes a top layer, a main substrate, and a bottom layer, wherein the resistive layer is disposed between the top layer and the main substrate, and the routing layer is disposed between the main substrate and the bottom layer.

In another form, the support pedestal further includes a second resistive layer disposed along the same plane as the routing layer. In this form, the routing layer has a higher resistance than that of the second resistive layer and either overlaps a portion of the second resistive layer or abuts the second resistive layer. In another form, a transition trace is disposed along the same plane as the second resistive layer and the routing layer, and a resistance of the transition trace is less than or equal to a resistance of the second resistive layer.

In a further form, the resistive layer has one or more of a two-wire heater configuration, a matrix wiring configuration for connecting the resistive layer to an external power source, and a multi-parallel wiring configuration for connecting the resistive layer to an external power source.

The present disclosure further provides a support pedestal that includes a plurality of resistive heating elements defining a plurality of heating zones, a routing layer including a central portion and a plurality of arm portions extending from the central portion, a main substrate disposed between the plurality of resistive heating elements and the routing layer, and a plurality of pairs of conductive vias extending through the main substrate and connected to the plurality of resistive heating elements. Each arm portion is connected to a corresponding pair of the conductive vias and the number of heating zones is greater than or equal to a number of wires coupled to the routing layer.

In the various forms, a control system may be provided that includes a plurality of power converters for adjusting power to the heating elements of the resistive layer.

The present disclosure further provides a support pedestal that includes a substrate having a first surface and a second surface, a first resistive layer having at least two zones and disposed on the first surface of the substrate, a second resistive layer having at least two zones and disposed on the second surface of the substrate, and a routing layer disposed on the same plane as the second resistive layer. A plurality of conductive vias electrically couple the routing layer to the first resistive layer. The number of zones of at least one of the first resistive layer and the second resistive layers is greater than or equal to a number of wires coupled to the routing layer.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The present disclosure will become more fully understood from the detailed description and the accompanying drawings, wherein:

FIGS. 19 and 20 are schematic views of a variant of a support member, wherein FIG. 19 shows a top perspective view of a main substrate, a resistive layer, and a top layer, and FIG. 20 shows a bottom perspective view of a main substrate, a routing layer, and a bottom layer;

FIGS. 26 and 27 illustrate a hot spot of a pedestal caused by a routing layer.

Corresponding reference numerals indicate corresponding parts throughout the several views of the drawings.

DETAILED DESCRIPTION

The following description is merely exemplary in nature and is not intended to limit the present disclosure, application, or uses.

Figure 1:
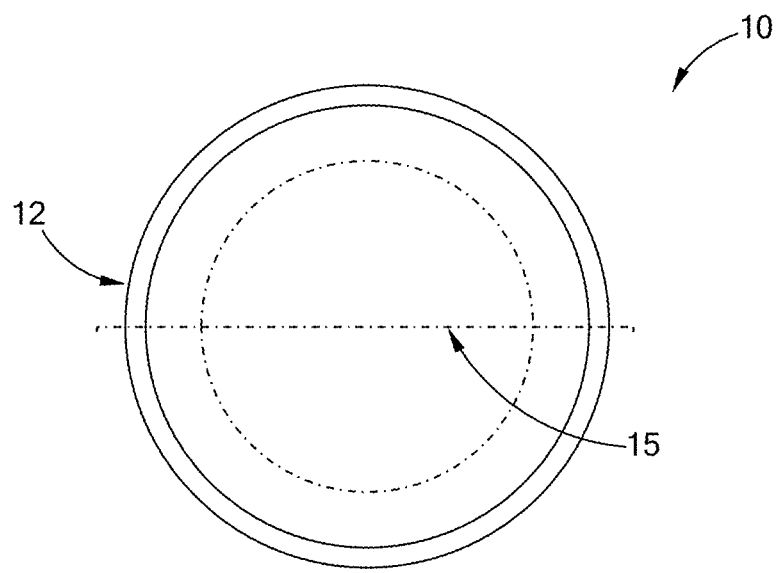
FIG. 1 is a top view of a support pedestal constructed in accordance with teachings of the present disclosure.
Figure 2:
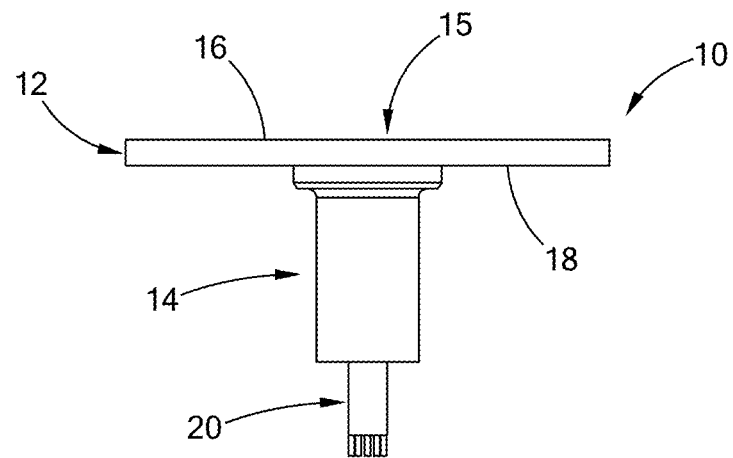
FIG. 2 is a side view of the support pedestal of FIG. 1.

Referring to FIGS. 1 to 2, a support pedestal 10 constructed in accordance with the teachings of the present disclosure may be used in a semiconductor processing chamber for supporting and heating a heating target, such as a wafer, thereon. The support pedestal 10 includes a support member 12 and a tubular shaft 14 attached to a central region 15 of the support member 12. The support member 12 includes a top surface 16 for supporting a substrate, such as a wafer (not shown) thereon, and a bottom surface 18 to which the tubular shaft 14 is attached. The support pedestal 10 further includes a plurality of electric cables 20 received in the tubular shaft 14 for connecting at least one electronic or electric element/layer 24 (shown in FIG. 3) embedded in the support member 12 and connected to an external power source. The electric layer 24 may be a resistive heating layer, a temperature sensor, an electrode for an electrostatic chuck (ESC), or a Radio Frequency (RF) antenna, etc., depending on the application. While not shown in the drawings, the support member 12 may optionally define a gas conduit for receiving a purge gas and a vacuum conduit to provide vacuum clamping for the wafer.

Figure 3:
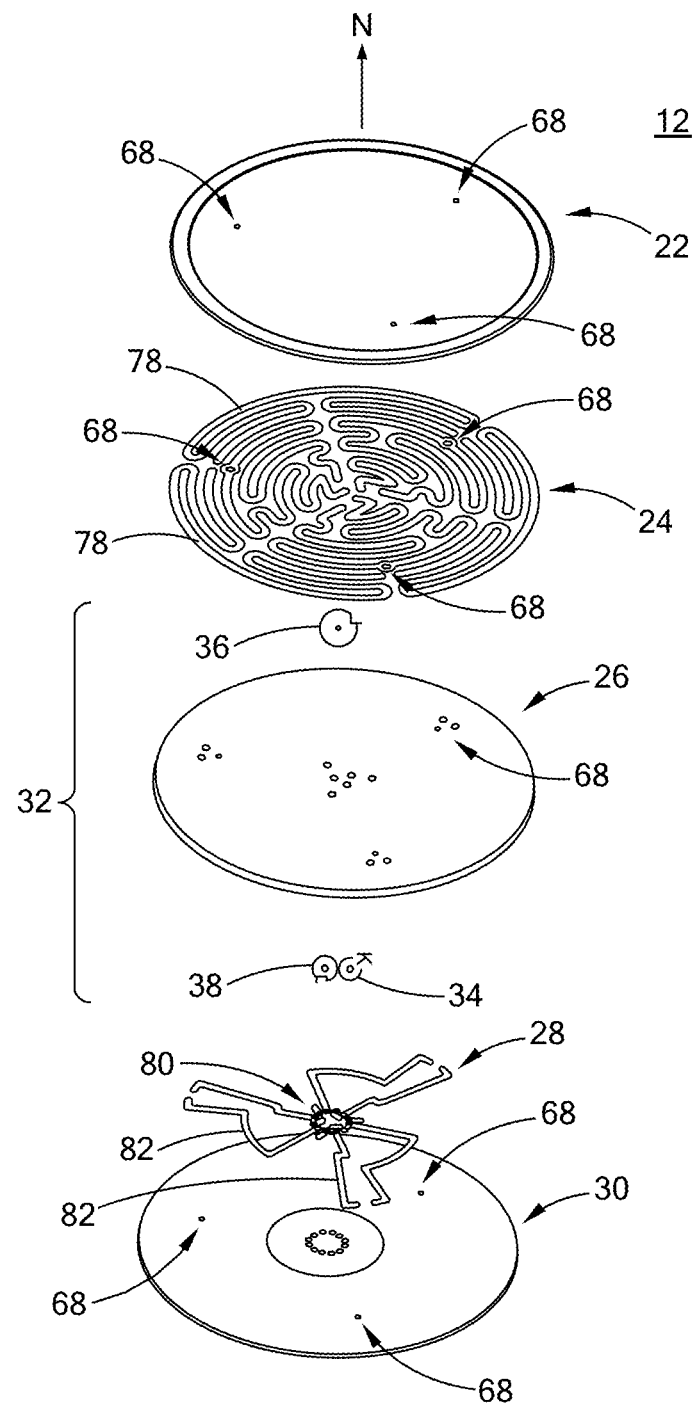
FIG. 3 is an exploded view of a support member of the support pedestal of FIGS. 1 and 2.

Referring to FIG. 3, in one form, the support member 12 includes a plurality of layers that are laminated to form an integrated structure. The plurality of layers include a top layer 22, a resistive layer 24 for generating heat, a main substrate 26, a routing layer 28, and optionally a bottom layer 30 arranged in the order from top to down. The resistive layer 24 and the routing layer 28 are disposed on opposite surfaces of the main substrate 26 and are disposed in different planes. The resistive layer 24 includes a plurality of resistive heating elements 78 that are independently controllable and that define a plurality of heating zones. In FIG. 3, six resistive heating elements 78 are shown to define six resistive heating zones. Any number of the resistive heating elements 78 can be used without departing from the scope of the present disclosure. Also, a plurality of substrates 26 may also be employed while remaining within the scope of the present disclosure.

It should be understood that the support member 12 is not limited by this specific multi-layered structure and the support member 12 may further comprise additional functional layers (e.g. bonding layer, dielectric layer, sensing layer, and protective layer, among others) while still remaining within the scope of the present disclosure. In one example, the support member 12 further comprises an integrated radio frequency (RF) grid layer, which is electrically connected to a ground terminal to compensate RF plasma or magnetic field imposed by processing chamber. Alternatively, the resistive layer 24 and/or the routing layer 28 is a RF grid layer. Generally, the RF grid layer is used as antenna to direct RF plasma or magnetic field imposed by the processing chamber through ground terminal and shield and protect heater and sensor devices.

The support member 12 further includes a plurality of conductive vias 32 (only one is shown in FIG. 3) and a plurality of electric terminals 34 (only one is shown in FIG. 3) disposed in a plane N normal to the support member 12. The plurality of conductive vias 32 extend through the main substrate 26 and connect the resistive layer 24 and the routing layer 28 that are disposed on opposite sides/surfaces of the main substrate 26. The plurality of electric terminals 34 are disposed adjacent to the side/surface of the main substrate 26 where the routing layer 28 is disposed to connect the routing layer 28 to the electric cables 20, which are disposed in the central region 15 and which, in turn, are connected to an external power source (not shown).

The routing layer 28 may be configured to include a central portion 80 and a plurality of arm portions 82 extending from the central portion 80 in a substantially radial direction for engaging a corresponding pair of conductive vias 32 and consequently a corresponding resistive heating element 78. In this form, each arm portion 82 of the routing layer 28 is a routing circuit for connecting a corresponding pair of electric terminals 34 to a corresponding pair of conductive vias 32 for controlling a corresponding heating zone of the resistive layer 24.

FIG. 3 shows the resistive layer 24 includes six independently-controlled resistive heating elements 78 and the routing layer 28 includes six arm portions 82. The resistive layer 24 can have any number of resistive heating elements 78 and resistive heating zones without departing from the scope of the present disclosure. The number of the arm portions 82 of the routing layer 28 and the number of the conductive vias 32 and the number of the electric terminals 34 depend on the number of the resistive heating elements 78 and the heating zones. Where the resistive layer 24 includes (n) resistive heating elements 78 that define (n) heating zones, (2n) conductive vias 32 and (2n) electric terminals 34 are provided for connecting (n) resistive heating elements 78 to an external power source, via (n) arm portions 82 of the routing layer 28, with each arm portion 82 being a routing circuit.

Figure 6:
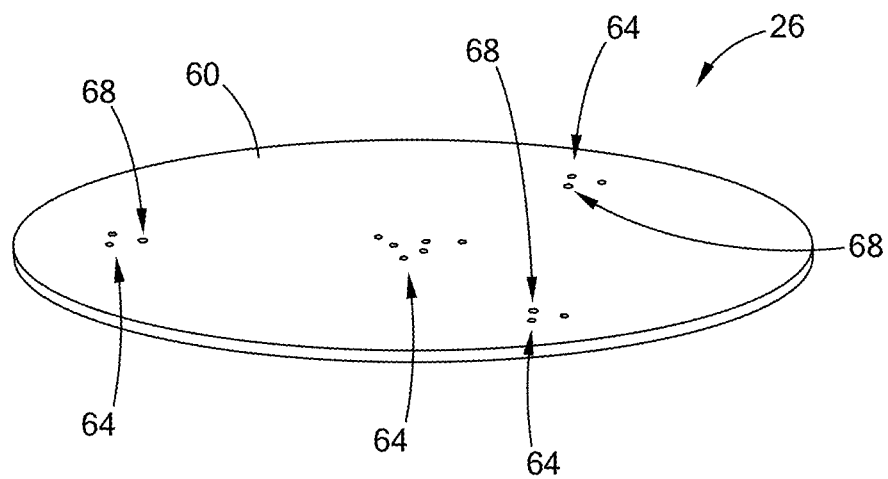
FIG. 6 is a top perspective view of a main substrate of a support member of FIG. 3.
Figure 7:
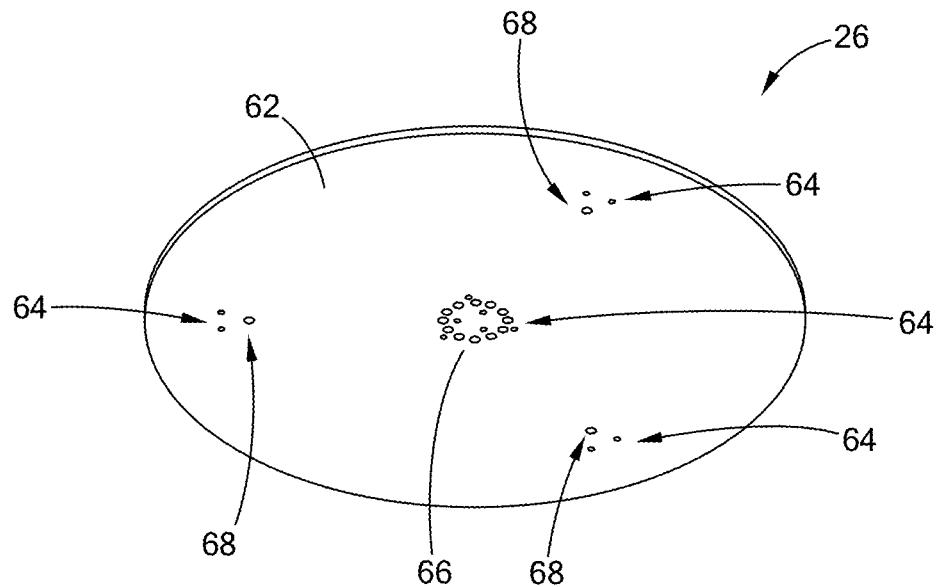
FIG. 7 is a bottom perspective view of the main substrate of FIG. 6.

The resistive layer 24 and the routing layer 28 are disposed at opposite sides of the main substrate 26 (e.g., top surface 60 and bottom surface 62 of the main substrate 26 as shown in FIGS. 6 and 7) such that the resistive layer 24 and the routing layer 28 are positioned perpendicular to the plane N normal to the support member 12. In this arrangement, routing layer 28 overlaps the resistive layer 24 and allows the resistive layer 24 to extend across the central region 15 of the support member 12 despite that the electric terminals 34 are disposed in the central region 15, thereby significantly reducing or eliminating the cold spots in the central region 15.

The top layer 22, the main substrate 26 and the bottom layer 30 may be made of ceramic materials, such as aluminum nitride (AlN), and may be in the form of a sintered or a machined ceramic plate. The plurality of conductive vias 32 may be in the form of a single conductive pin or may be formed to have multiple pieces.

Figure 4:
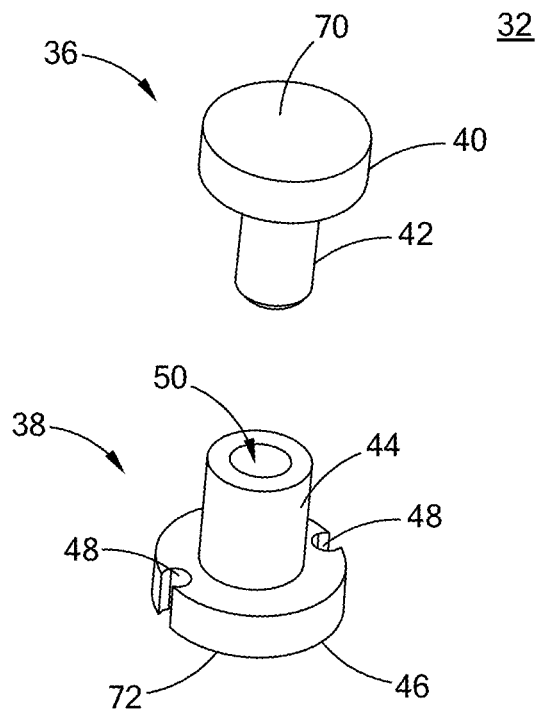
FIG. 4 is an exploded perspective view of a conductive via of a support member of FIG. 3.

Referring to FIG. 4, in one form, the plurality of conductive vias 32 each include a via head 36 and a via base 38. The via head 36 includes an enlarged head portion 40 and a cylindrical portion 42 attached to the enlarged head portion 40. The via base 38 includes an enlarged bottom portion 46 and a tubular portion 44 attached to the enlarged bottom portion 46. The via base 38 defines a through hole 50 extending along its length for receiving the cylindrical portion 42 of the via head 36 therein. The enlarged bottom portion 46 of the via base 38 defines a pair of cutouts 48 to help secure the routing layer 28 to the conductive vias 32. The conductive vias 32 each include a top surface 70 and a bottom surface 72.

Figure 5:
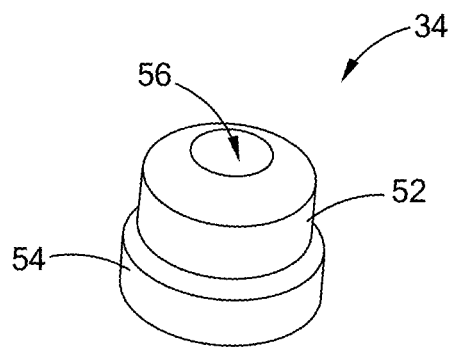
FIG. 5 is a perspective view of an electric terminal of a support member of FIG. 3.
Figure 14:
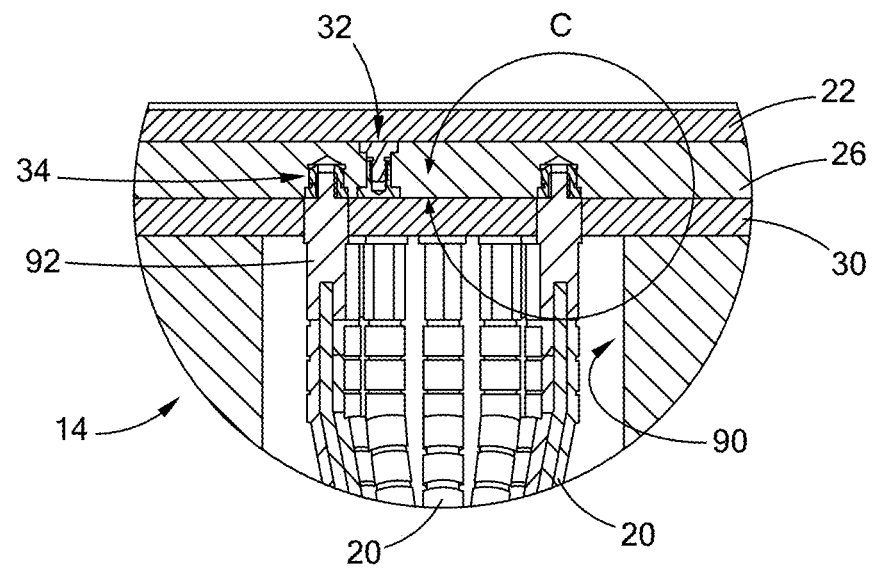
FIG. 14 is an enlarged cross-sectional view of portion B of FIG. 13.
Figure 15:
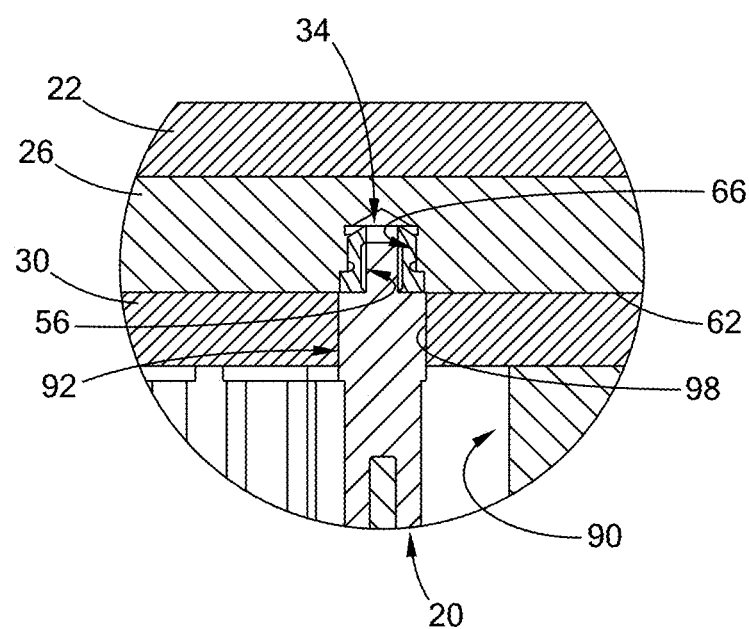
FIG. 15 is an enlarged cross-sectional view of portion C of FIG. 14.
Figure 16:
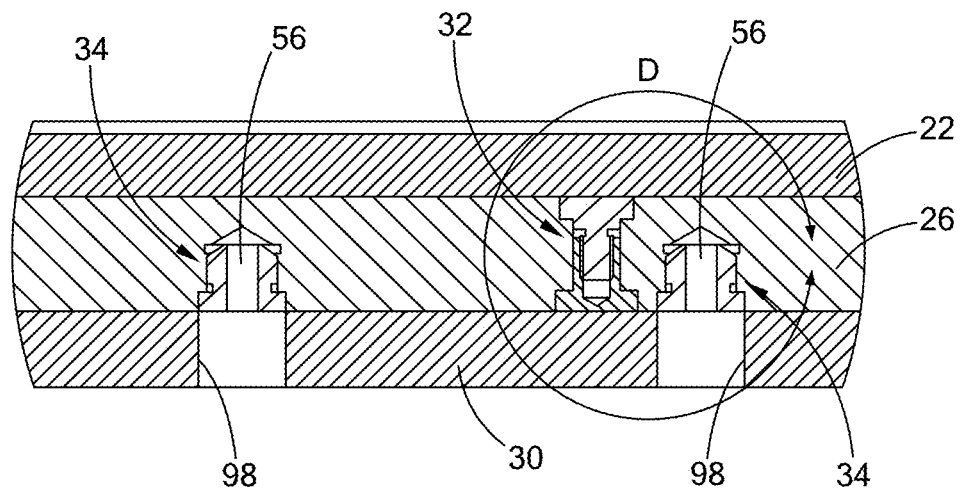
FIG. 16 is a partial cross-sectional view of the support member of FIG. 3, showing a conductive via and two electric terminals inserted in a main substrate.
Figure 17:
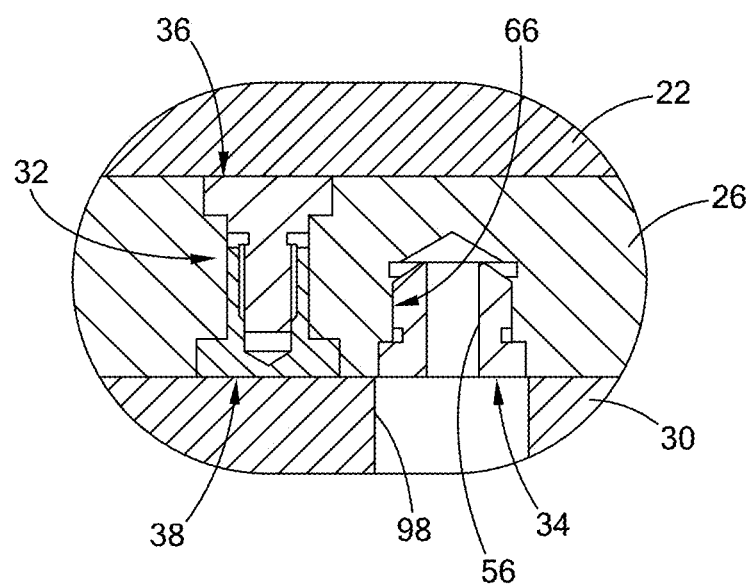
FIG. 17 is an enlarged cross-sectional view of portion D of FIG. 16.

Referring to FIG. 5, the electric terminal 34 includes an upper portion 52 and a lower enlarged portion 54. The electric terminal 34 may be in the form of a socket defining an insertion hole 56 for receiving a terminal end 92 (shown in FIG. 14) of a corresponding electric cable 20.

Referring to FIGS. 6 and 7, the main substrate 26 includes a top surface 60, a bottom surface 62, a plurality of via apertures 64 extending through the main substrate 26 for receiving the plurality of conductive vias 32, a plurality of blind recesses 66 open to the bottom surface 62 for receiving the plurality of electric terminals 34, and a plurality of alignment holes 68. The number of the via apertures 64 correspond to the number of the conductive vias 32. The number of the blind recesses 66 correspond to the number of the electric terminals. 34. As clearly shown in FIG. 3, the top layer 22 and the bottom layer 30 also have corresponding alignment holes 68 aligned with the alignment holes 68 of the main substrate 26 to facilitate alignment of the top layer 22, the main substrate 26, and the bottom layer 30 when these layers are bonded or sintered into one integrated unit.

Figure 8:
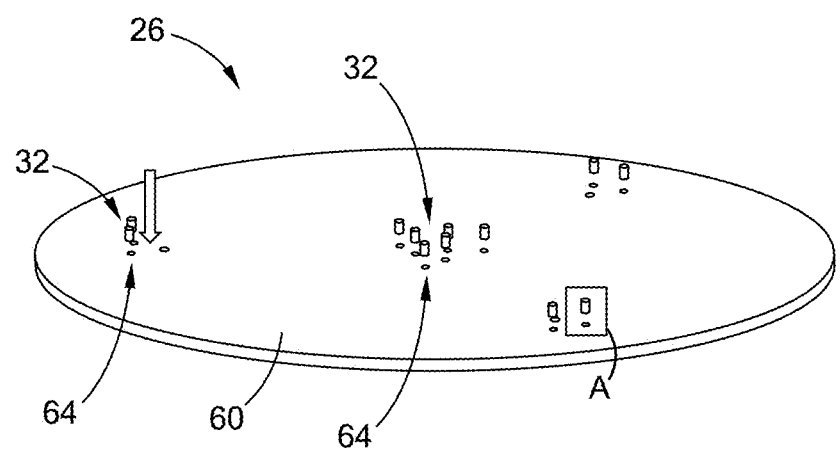
FIG. 8 is a top perspective view of a main substrate and a plurality of conductive vias of a support member of FIG. 3.
Figure 9:
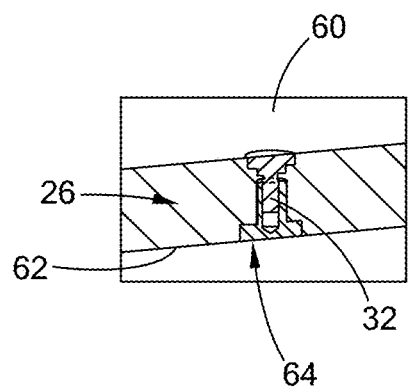
FIG. 9 is an enlarged cross-sectional view of portion A of FIG. 8, showing insertion of a conductive via into a via hole of the main substrate.

Referring to FIGS. 8 and 9, the plurality of via apertures 64 are configured to receive the plurality of conductive vias 32 therein, with the top surfaces 70 and bottom surfaces 72 of the conductive vias 32 (more specifically, the top surfaces 70 of the via heads 36 and the bottom surfaces 72 of the via bases 38) flush with the top surface 60 and bottom surface 62 of the main substrate 26, respectively. Twelve (12) via apertures 64 are shown in FIG. 8 to receive twelve (12) conductive vias 32. The via head 36 may be fastened to the via base 38 by any conventional securing method, including but not limited to, threaded connection, friction fit, fusion brazing, and sintering. Additional information regarding sintering of such vias has been disclosed in Applicant's concurrently filed co-pending application titled "DUAL-PURPOSE VIAS FOR USE IN CERAMIC PEDESTALS" which is commonly owned with the present disclosure and the contents of which are incorporated herein by referenced in its entirety. The blind recesses 66, the electric terminals 34, and the central portion 80 of the routing layer 28 are disposed in the central region 15 of the support member 12.

It should be understood that although the via apertures 64 are shown extending all the way through the main substrate 26 (e.g., from the top surface 60 to the bottom surface 62), the via apertures 64 may extend only partially into the main substrate 26 such that each via aperture 64 is only open to the top or bottom surface 60, 62 of the main substrate 26 while still remaining within the scope of the present disclosure.

Figure 10:
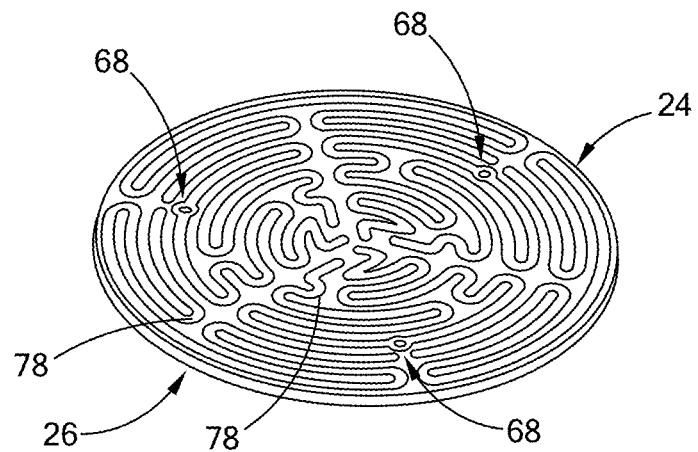
FIG. 10 is a perspective view of a resistive layer formed on a main substrate of a support member of FIG. 3.

Referring to FIG. 10, the resistive layer 24 is disposed between the top layer 22 and the main substrate 26 and may be formed on the top surface 60 of the main substrate 26 by, for example, physical vapor deposition (PVD), sputtering, thin foil, or any methods known in the art.

Figure 11:
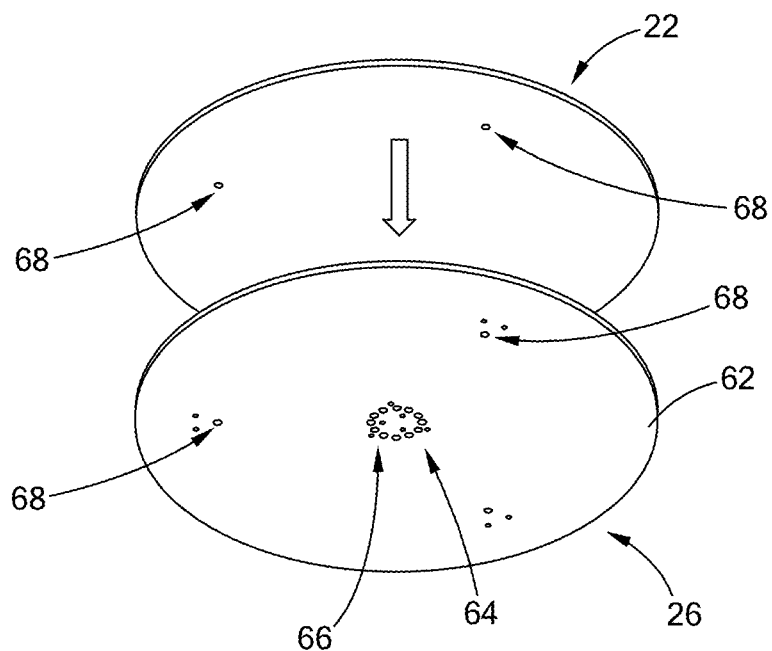
FIG. 11 is a perspective view of a top layer and a main substrate of the support member of FIG. 3.
Figure 12:
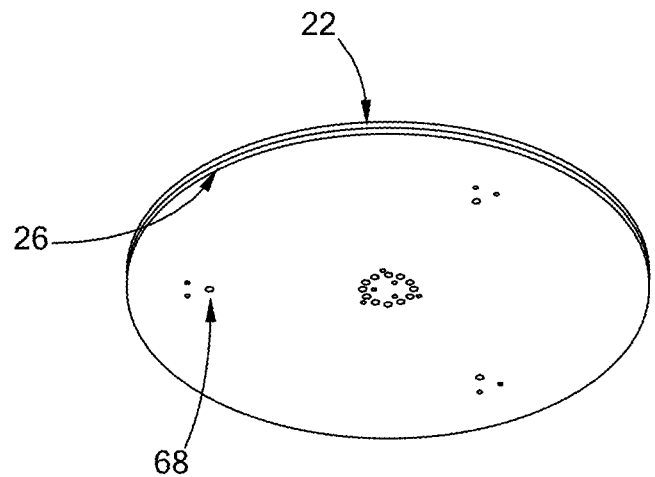
FIG. 12 is a perspective view of a top layer and a main substrate that are bonded together to form a monolithic plate.

Referring to FIGS. 11 and 12, after the resistive layer 24 is formed on the top surface 60 of the main substrate 26, the top layer 22 may be bonded to the top surface 60 of the main substrate 26 by hot pressed diffusion-bonding to encapsulate the resistive layer 24 therebetween and to create an aluminum nitride (AlN) monolithic structure. Optionally, the bottom layer 30 may also be bonded to the bottom surface 62 of the main substrate 26 in the same step or in a different step, with the routing layer 28 disposed between the main substrate 26 and the bottom layer 30 to bond the top layer 22, the resistive layer 24, the main substrate 26, the routing layer 28, and the bottom layer 30 together. Similarly, the routing layer 28 may be formed on the bottom surface 62 of the main substrate 26 by PVD, sputtering, thin foil, or any other conventional methods.

Figure 13:
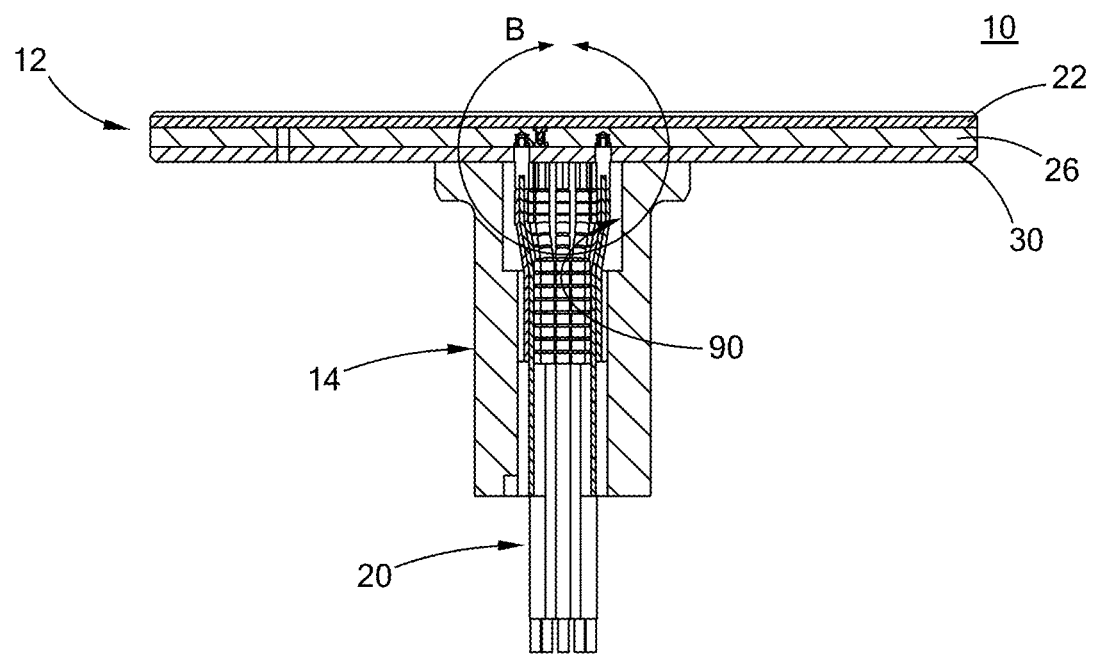
FIG. 13 is a cross-sectional view of a support pedestal of FIG. 1.

Referring to FIG. 13, the tubular shaft 14 is connected to the support member 12 and defines a receiving space 90 in which the plurality of electric cables 20 are disposed.

Referring to FIGS. 14 to 17, the plurality of blind recesses 66 are recessed from the bottom surface 62 of the main substrate 26 to receive the plurality of electric terminals 34 therein. The bottom layer 30 includes a plurality of through holes 98 aligned with the plurality of blind recesses 66. The electric cables 20 each have a terminal end 92 inserted through the through holes 98 of the bottom layer 30 and into the insertion hole 56 of the electric terminals 34 received in the blind recesses 66 of the main substrate 26 to establish electrical and physical connection between the electric cables 20 and the electric terminals 34. It is understood that the terminal ends 92 of the electric cables 20 can be connected to the electric terminals 34 using any conventional methods without being limited to the method disclosed herein.

Figure 18:
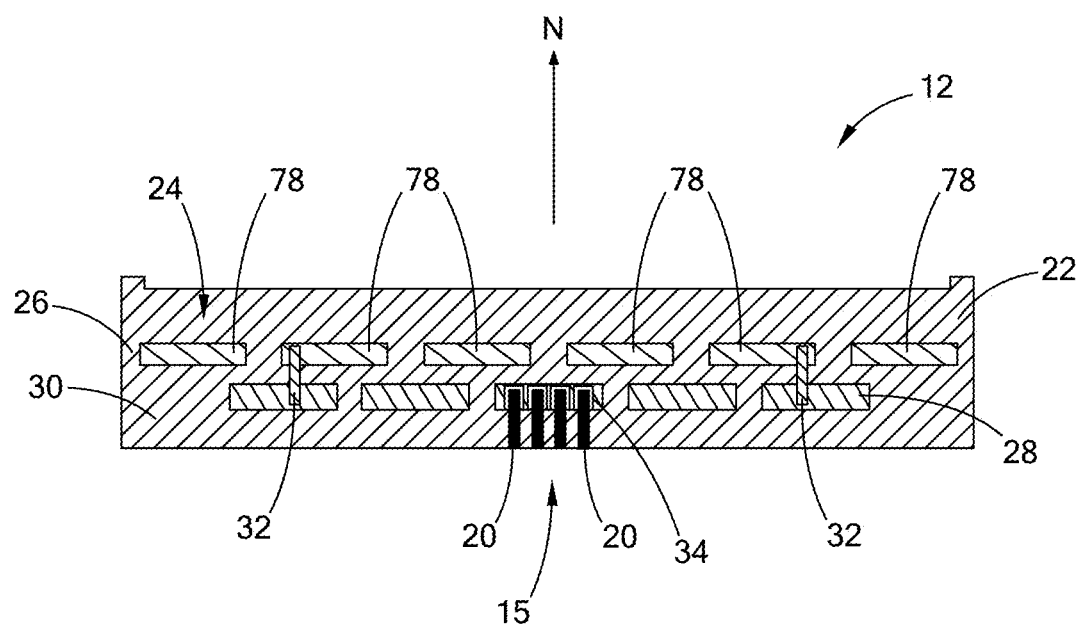
FIG. 18 is a schematic view of a support member of FIG. 3, illustrating connections among the resistive layer, the conductive vias, the routing layer, the electric terminals, and electric cables to an external power source.

Referring to FIG. 18, the resistive layer 24 includes a plurality of resistive heating elements 78 and is disposed above the routing layer 28. The resistive layer 24 and the routing layer 28 are disposed in different planes of the support member 12. Therefore, the resistive layer 24 can extend across the central region 15 of the support member 12 to reduce cold spots in the central region 15. With the resistive layer 24 and the routing layer 28 in different planes, the resistive heating elements 78 each are connected to a corresponding arm portion 82 of the routing layer 28 by a corresponding pair of conductive vias 32 disposed in a plane N normal to the support member 12. Each of the arm portions 82 of the routing layer 28 is a routing circuit to connect the resistive heating element 78 to a pair of electric terminals 34 disposed in the central region 15 of the support member 12. The electric terminals 34 are connected to the electric cables 20, which, in turn are connected to an external power source.

Moreover, with the resistive layer 24 and the routing layer 28 in different planes, the resistive layer 24 can be configured to overlap the routing layer 28, resulting in more coverage areas available for the resistive layer 24. As such, the support member 12 can be configured to have multiple heating zones with distributed wattage into the ceramic substrate. Further, the resistive layer 24 having multiple heating zones can also be used as temperature sensors by using the resistance change of the resistive heating elements 78. Therefore, the wiring structure of the support member 12 can be simplified, which is described in greater detail below.

Figure 19:
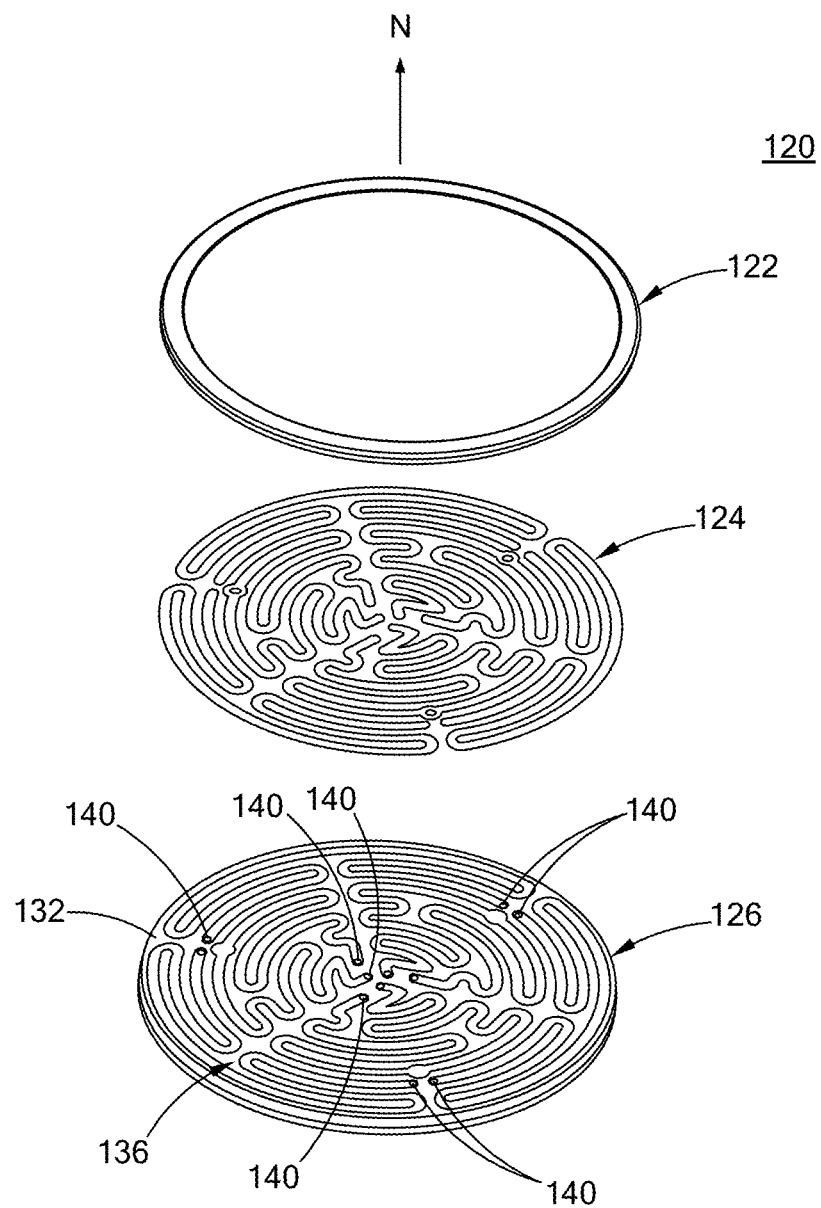

Referring to FIGS. 19 and 20, a variant of a support member constructed in accordance with the teachings of the present disclosure has a structure similar to that of the support member 12 of FIG. 3 except that the main substrate has trenches for receiving the resistive layer and the routing layer therein. As an example, the support member may be formed by a damascene fabrication process. In a damascene process, the main substrate includes a dielectric layer, which is patterned to form a trench having the shape of a metal layer, followed by forming the metal layer in the trench. The damascene process is opposed to a photolithographic method where the metal pattern is first formed on the main substrate by using a photoresist pattern as a mask, followed by printing or depositing a dielectric material around the metal pattern to form a planar surface.

More specifically, the support member 120 includes a top layer 122, a resistive layer 124, a main substrate 126, a routing layer 128, and a bottom layer 130 arranged in the order from top to down. The main substrate 126 has opposing top surface 132 and bottom surface 134. The top surface 132 defines a first trench 136 having a shape corresponding to the shape of the resistive layer 124 for receiving the resistive layer 124 therein. The bottom surface 134 of the main substrate 126 defines a second trench 138 having a shape corresponding to the shape of the routing layer 128 for receiving the routing layer 128 therein. The resistive layer 124 and the routing layer 128 may be formed in the first and second trenches 136, 138, respectively, by depositing one or more metal materials in each of the first and second trenches 136 and 138. Alternatively, the resistive layer 124 and the routing layer 128 may be in the form of a metal sheet having the desired shape/pattern and are placed in the first trench 136 and the second trench 138. It should be understood that a plurality Like the support member 12 of FIG. 3, the support member 120 includes a plurality of conductive vias 140 extending in one form along a direction N parallel to the support member 120 and disposed in the corresponding via cavities (not shown) through the main substrate 126. Similarly, electric terminals 142 are formed at a bottom surface 134 of the main substrate 126 to connect the routing layer 128 to the electric cables (not shown in FIGS. 19 and 20)

The top layer 122, the main substrate 126, and the bottom layer 130 are made of ceramic materials, such as aluminum nitride (i.e., alumina). The top layer 122, the main substrate 126, and the bottom layer 130 may each be a green ceramic plate and may be sintered together, such as by hot pressing, to form a monolithic ceramic substrate to encapsulate the resistive layer 124 and the routing layer 128 therein.

Alternatively, the top layer 122, the main substrate 126, and the bottom layer 130 are machined ceramic plates and are bonded together by any conventional bonding methods, such as thermal bonding and diffusion bonding, without any sintering process. Alternatively, one or more of the top layer 122, the main substrate 126, and the bottom layer 130 are in green state, whereas the other(s) is/are a machined plate. The machined plate may be bonded to the sintered structure by hot pressed diffusion bonding to form a hybrid structure including both green plates and sintered diffusion bond.

In the support members 12, 120 of the present disclosure, while not particularly described and shown in the figures, one or more dielectric layers may be formed on the surfaces of the top layer, the main substrate and the bottom layer to insulate the resistive layer and the routing layer or to facilitate bonding of the resistive layer and the routing layer to the main substrate without departing from the scope of the present disclosure. The plurality of conductive vias and the electric terminals may be arranged to extend in the plane N normal to the support member or in an angle relative to the normal plane N as long as the resistive heating layer and the routing layer, in different planes, can be connected and the routing layer can be properly connected to the electric cables.

Figure 21:
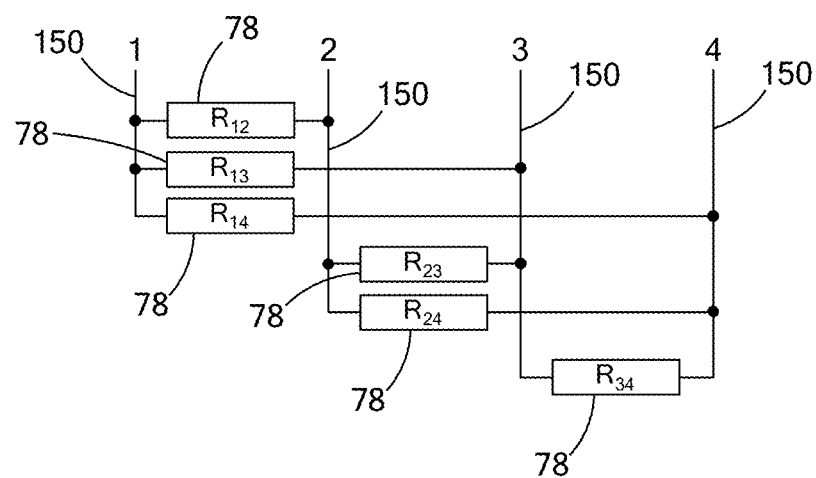
FIG. 21 is a schematic diagram of a wiring structure for controlling the resistive layer of the support pedestal of FIG. 3.

Referring to FIG. 21, a control system for controlling the resistive layer 24, 124 having multiple heating zones is described. The support member 12, 120 can be connected to a control system using a closed loop control by using Adaptive Thermal System (ATS) technology to control all of the heating zones without additional sensors. The adaptive thermal system combines the heater design with a control system to deliver differentiated closed loop control while simplifying system integration. The resistive heating elements 78 of the resistive layer 24, 124 include a material that has relatively high temperature coefficient of resistance (TCR), such as molybdenum, titanium, nickel, such that the resistive layer 24, 124 itself can also be used as a sensor to provide temperature information based on resistance change of the resistive heating circuits.

In other words, the temperature of the resistive heating elements 78 is inferred via the resistance change of the resistive heating element having relatively high temperature coefficient of resistance. Therefore, no additional temperature sensors, such as thermocouples, are needed, thereby simplifying the wiring connection in the support pedestal 10. Using resistive heating elements 78 rather than thermocouples can provide better temperature feedback and closed loop control on multiple heating zones to reduce ceramic breakage risk at higher temperatures. Various forms of this "two-wire" configuration is described in greater detail below.

In addition, matrix and multi-parallel wiring topologies are integrated with custom control algorithms. As shown in FIG. 21, the resistive heating elements 78 and the wirings for connecting the resistive heating elements 78 to an external power source are arranged such that every pair of wires 150 has a resistive heating element 78 connected between them. Such wiring arrangement has been described in U.S. Pat. No. 9,123,755 titled, "System and Method for Controlling a Thermal Array," and its related patents/applications, which are commonly assigned with the present application and the contents of which are incorporated herein by reference in their entirety. The wiring arrangement allows for simultaneous power control and temperature sensing of all the resistive heating elements 78 to protect the ceramic materials of the support member 12, 120 from breakage when a temperature at certain areas of the support member 12, 120 becomes too high and exceeds a threshold temperature. In addition, the control scheme allows the use of fewer wirings with better control to achieve better thermal performance of the support pedestal 10. For example, in one form, the number of heaters that can be connected using the wiring topologies described herein is equal to n(n−1)/2, where n is the number of wires. Accordingly, the number of heaters/zones is generally greater than or equal to the number of wires.

In one form of the present disclosure, the resistive heating elements 78 of the resistive layer 24 are used for generating heat and for detecting temperature of the element. In other words, the resistive heating elements 78 are "two-wire" heating elements such that they function as heaters and as temperature sensors with only two leads wires operatively connected to the heating element rather than four (e.g., two for the heating element and two for a discrete temperature sensor). Such a two-wire capability is disclosed for example in U.S. Pat. No. 7,196,295, which is commonly assigned with the present application and incorporated herein by reference in its entirety.

Generally, the control system, which is in communication with the first and second lead wires, is configured to measure changes in voltage at between the two lead wires. More specifically, the control system measures millivolt (mV) changes across the lead wires and then uses these changes in voltage to calculate an average temperature of the resistive heating element. In one form, the control system may measure changes in voltage without interrupting power to the resistive heating element. This may be accomplished, for example, by taking a reading at the zero crossing of an AC input power signal. In another form, power is interrupted and the control system switches from a heating mode to a measuring mode to measure the changes in voltage. Once the average temperature is determined, the control system switches back to the heating mode.

Different heating elements of the resistive layer may not be heated at the same rate even though the same power supply is applied to the heating elements. This may be caused by various factors, such as positions of the heating elements relative to heat sinks and the manufacturing non-uniformity in the heating zones. When a significant temperature difference occurs between adjacent heating zones, an induced thermomechanical stress due to significant difference in thermal expansion in the adjacent heating zones may result in cracks in the ceramic substrate of the heating plate. To address this concern, in one form of the present disclosure, the control system includes a power conversion system having one or more power converters for adjusting the power applied to the resistive layer.

Figure 22:
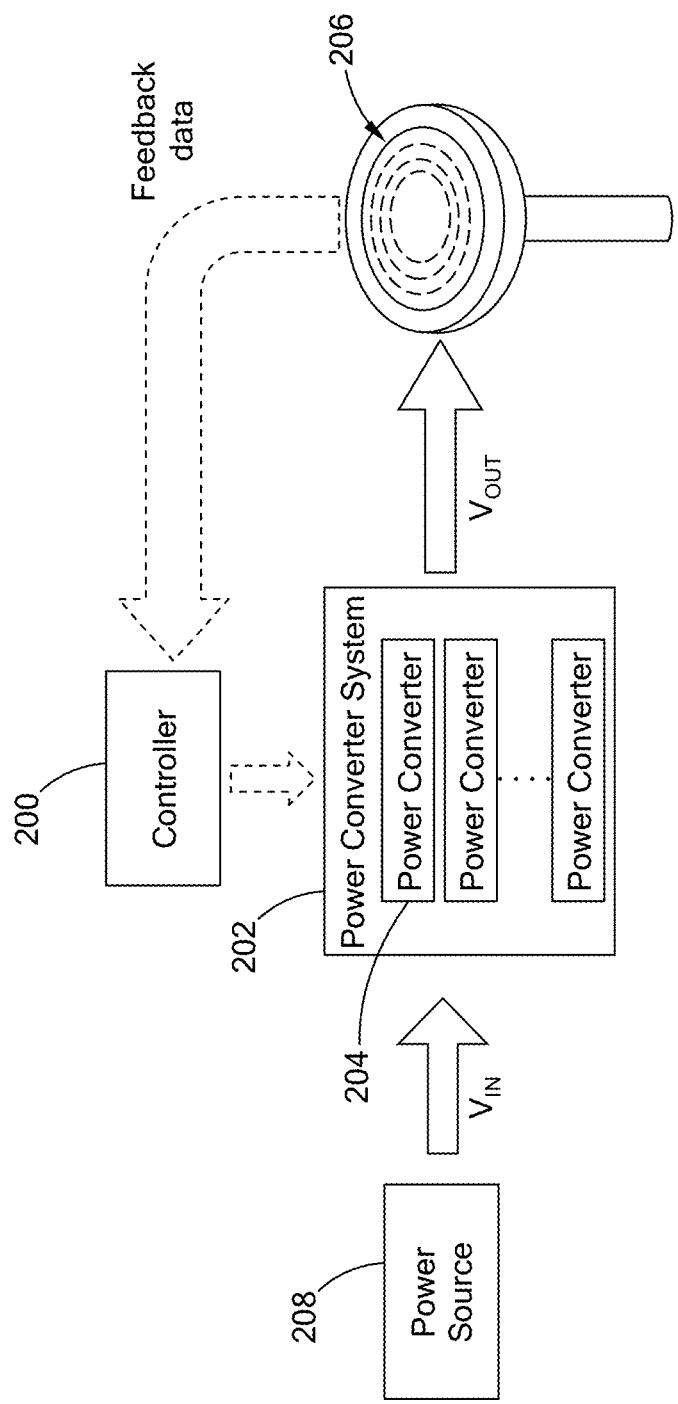
FIG. 22 is a block diagram of a control system having a power converter system in accordance with the teaching of the present disclosure.

Referring to FIG. 22, the control system includes a controller 200 and a power converter system 202 that includes a plurality of power converters 204. One or more power converters 204 are connected to heating elements of a resistive layer of a support pedestal 206. Each power converter 204 is operable to adjust an input voltage ($V_{IN}$) from the power source 208 to an output voltage ($V_{OUT}$) that is applied to the heating elements, where the output voltage is less than or equal to the input voltage.

Figure 23:
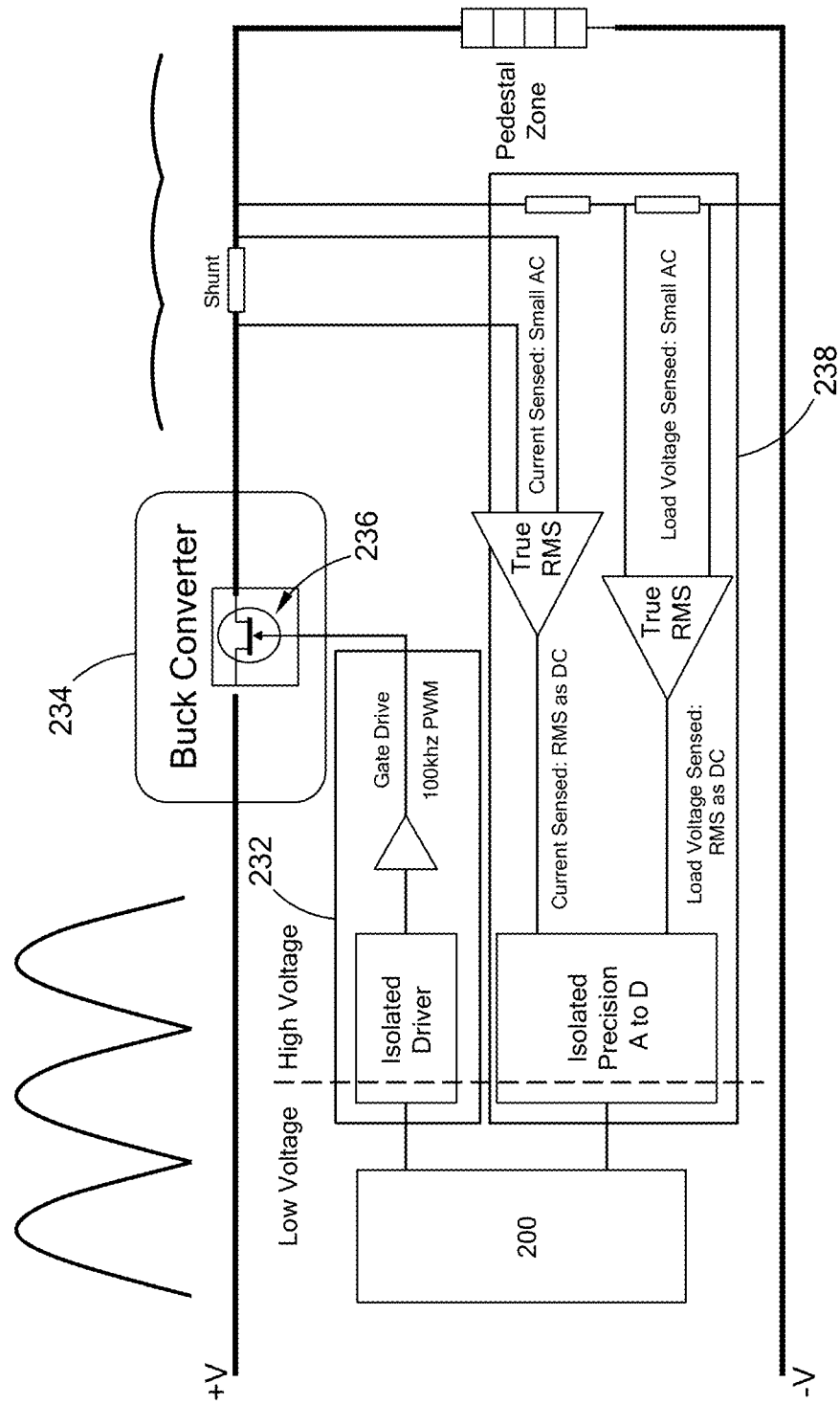
FIG. 23 is a block diagram of a power converter of the power converter system in accordance with the teaching of the present disclosure.
Figure 24C:
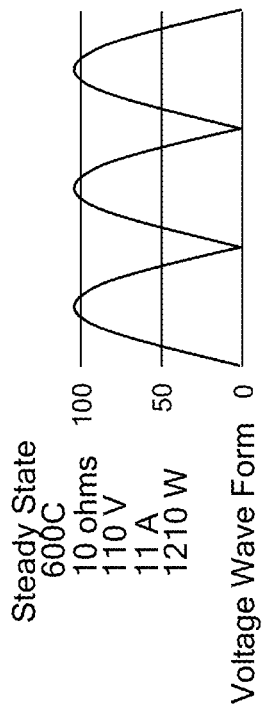
FIGS. 24A, 24B, 24C, and 24D illustrate waveforms of different output voltages of the power converter based on different input conditions in accordance with the teachings of the present disclosure.
Figure 24D:
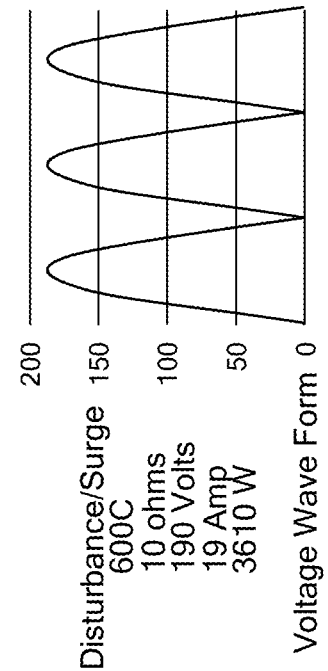
Figure 24A:
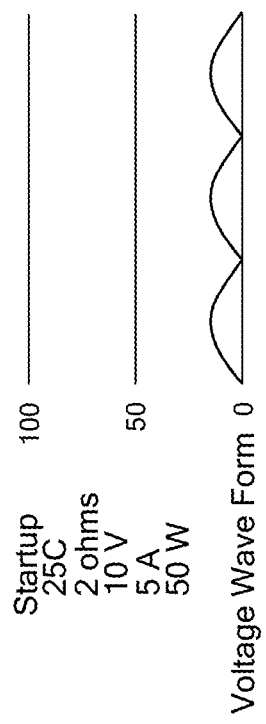
Figure 24B:
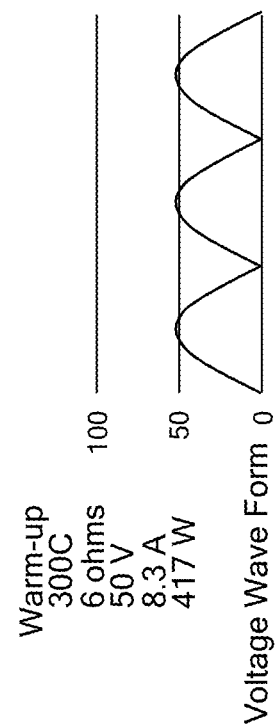

Referring to FIG. 23, a given power converter 204 includes a driver circuit 232 and a buck converter 234 having a control switch 236 that is a field effect transistor. The driver circuit 232 operates the control switch 236 based on an input signal from the controller 200.

Generally, the buck converter 234, as a step-down voltage converter, is operable to decrease the voltage from the power source 208. Specifically, the AC voltage from the power source 208 (e.g., 208 VAC) is rectified to a DC voltage that is then received by the buck converter 234. Based on the operation of the control switch 236, the buck converter 234 decreases the voltage and increases the current from the power source 208 and applies the adjusted voltage and current to respective heating elements. The conduction rate of the control switch controls the amplitude of the output voltage, such that a low conduction rate of the control switch outputs a low amplitude output voltage and a high conduction rate of the control switch outputs a high amplitude output voltage. To reduce voltage ripple, filters made of capacitors or a combination of capacitor and inductors are added to the output and/or the input of the buck converter 234. Additional information regarding the power conversion system has been disclosed in Applicant's co-pending application, U.S. Ser. No. 15/624,060, filed Jun. 15, 2017 and titled "POWER CONVERTER FOR A THERMAL SYSTEM" which is commonly owned with the present application and the contents of which are incorporated herein by reference in its entirety.

The controller 200 includes electronics including microprocessor and memory and is configured to control the power supplied to the resistive heating elements by the power converter system 202. The controller 200 operates the power converter system 202 to adjust the voltage applied to the heater elements based on feedback data from the heating elements of the pedestals and pre-stored control algorithms and/or processes. The feedback information includes at least one of resistance, load current, and/or voltage. The load current and/or voltage may be detected by a sensor circuit 238.

In one form of the present disclosure, an input voltage from the power source 208 is scaled using a scaling factor, such as that disclosed in U.S. Pat. Nos. 7,257,464 and 8,423,193, which are commonly assigned with the present application and the contents of which are incorporated herein by reference in their entirety. The input voltage can be scaled based on a preset user value. The preset user value is one of maximum voltage output level and maximum power output level, or generally may be current, voltage, or wattage. The current is measured simultaneously with scaling the voltage and providing power to the heater. The scaling comprising a gradual ramp-up to detect heater characteristics during the ramp-up.

In one more form of the present disclosure, the controller 200 determines the desired output voltage of a given power converter 204 based on data from the sensor circuit 238, and on operational state of the heating element, such as heater type, open heater, shorted heater, start-up, warm-up, steadstate, and/or heater temperature. In this example, the controller is configured to operate the power converters to adjust the voltage based on the temperature of the heating elements of the heater such that power from a given power converter matches the change in the temperature of respective heating elements. In another form, the controller switches the control switch at a selected duty cycle, where the duty cycle is determined based on an operation mode of the heating elements. For example, FIGS. 24A to 24D illustrate output voltage waveforms of a power converter that provides power to one or more heating elements of a heater during a start-up mode, a warm-up mode, a steady state mode, and at a disturbance, respectively. As shown, the voltage waveforms applied to the heating elements are different. The voltage varies depending on the resistance of the heating elements, the current flowing through the heating elements, and the temperature of the heating elements. During start-up and warm-up when the temperature is relatively low, the voltage has a relatively small amplitude and thus, the wattage is relatively low. During steady state and disturbance/surge when the temperature is relatively high, the amplitude of the voltage is increased resulting in higher wattage. Additional information regarding such control scheme has been disclosed in Applicant's co-pending provisional application, U.S. Ser. No. 62/543,457, filed Aug. 10, 2017 and titled "SYSTEM AND METHOD FOR CONTROLLING POWER TO A HEATER" which is commonly owned with the present application and the contents of which are incorporated herein by reference in its entirety.

By having the power converter system 202, the control system varies the power to the heating elements for a precise and safer control of the heating elements and thus, the heater. For example, lower power may be supplied to one or more heating elements to minimize peak current or may be provided at an early stage of the heating and during shutdown to prevent thermal cracks in the substrate of the heating plate. The controller 200 controls the power converter system 202 to output different voltages and thus, controls the temperature of the individual heating zones. Accordingly, the control system adjusts the temperature differences between different zones to provide uniform temperature throughout the heater of the pedestal.

As set forth above, the routing layer 28, 128 is configured to electrically couple the resistive heating elements 78 to the electric terminals 34, 142 to supply electric power to the resistive heating elements 78. In an ideal implementation, the routing layer 28, 128 emanates as little heat as possible so as to not affect the thermal profile of the support member 12, 122. However, in some implementations, the routing layer 28, 128 may generate heat that can cause "hot spots" along the surface of the routing layer 28, 128, which can translate to hot spots along the ceramic pedestal.

Figure 25:
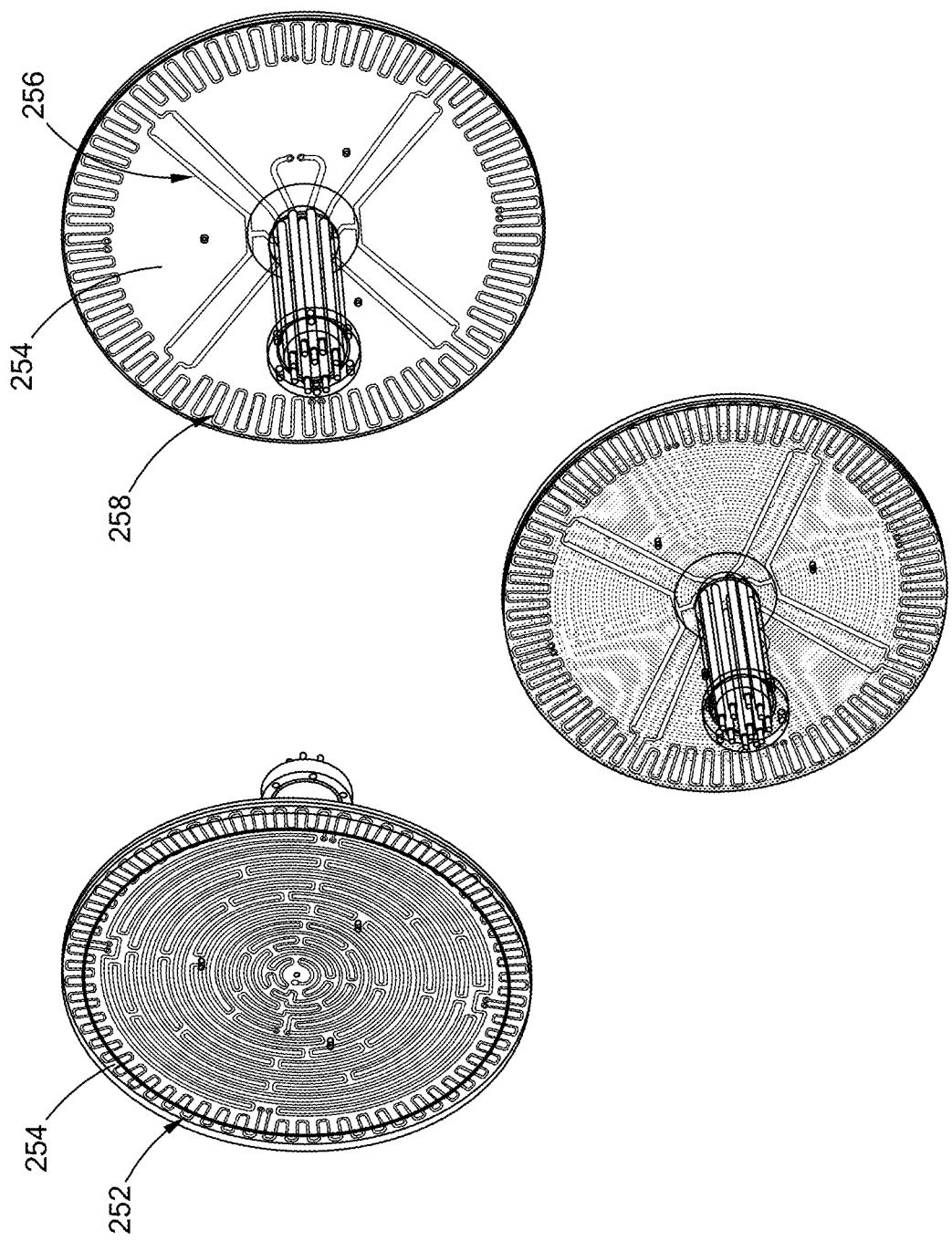
FIG. 25 illustrates a two-layer pedestal for a thick routing layer in accordance with the teaching of the present disclosure.

For example, FIG. 25 illustrates a two-layer pedestal having a first resistive layer 252, a routing layer 256, and a second resistive layer 258. In this example, the first resistive layer 252 is a top heating layer disposed on a main substrate 254 and the second resistive layer 258 is a bottom heating layer disposed on a bottom surface of the substrate 254. The top heating layer 252 is a six-zone heater with four outer quadrant shaped zones, an intermediate washer shaped zone, and an inner disc-shaped zone. The bottom heating layer 258 is a four-zone heater with a four outer quadrant shaped zones. The routing layer 256 extends between a central region of the main substrate 254 to the bottom heating layer 258 and is on the same plane as the bottom heating layer 258. The routing layer 256 is electrically coupled to the top heating layer 252 by way of vias and to the bottom heating layer 258 by way of circuit traces. Using the wiring topologies set forth above, in one form, the number of zones of the top heating layer 252 and/or the bottom heating layer 258 is greater than or equal to the number of wires coupled to the routing layer.

Generally, the circuit trace for a heating layer is very thin (e.g., 1-2 mm) to create the necessary resistance to generate the required wattage. However, for a routing layer 256, the thin trace generates too much heat due to the current density carried by the routing layer 256 and thus, causes a heat spot in the thermal profile. For example, referring to FIGS. 26 and 27, an expected thermal profile of the pedestal surface of the support member having a thin routing layer trace includes a hot spot 260 that is caused by the routing layer beneath zones 1 and 2.

Figure 28:
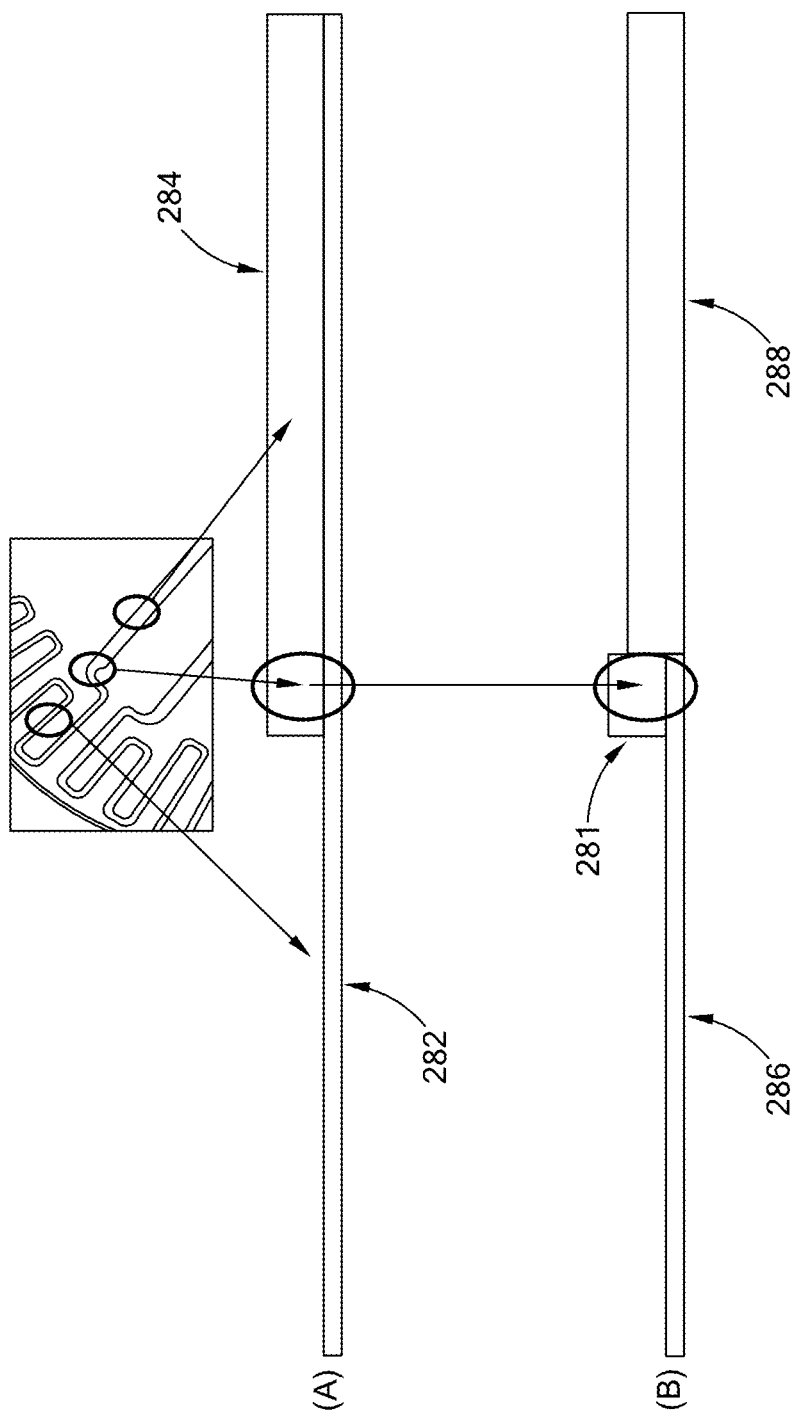
FIG. 28 illustrates a thin heating layer and thick routing layer configuration in accordance with the teaching of the present disclosure.

Referring to FIGS. 25 and 28, to address the hot spot 260 and varied temperature across the pedestal surface due to the routing layer 256, the thickness of the routing layer 256 is increased while the thickness of the bottom heating layer 258 is thin. For example, in one form of the present disclosure, the routing layer 256 is formed by two layers traces (i.e., foil). Specifically, in (A) of FIG. 28, a first trace 282 forms the bottom heating layer 258 and the routing layer 256 at a first thickness (e.g., 2 mm) and a second trace 284 having a second thickness (e.g., 5 mm) is layered on top of the first trace 282 at regions that form the routing layer 256. Accordingly, the bottom heating layer 258 has a thin thickness (e.g., 2 mm) for generating the necessary heat and the routing layer 256 has a thick thickness (e.g., 7 mm) to significantly reduce or prevent heat generation as current flows through the routing layer 256.

In another form of the present disclosure, the routing layer 256 and the bottom heating layer 258 are formed by two different traces with a transition trace connecting the heating layer 258 and the routing layer 256. Specifically, in (B) of FIG. 28, a first trace 286 having a first thickness (e.g., 2 mm) forms the bottom heating layer 258 and a second trace 288 having a second thickness greater than the first thickness (e.g., 5 mm) forms the routing layer 256. A transition trace 281 having thickness greater than or equal to the first thickness (e.g., 7 mm) forms a transition region that electrically couples the heating layer 258 and the routing layer 256. Similar to the configuration in (A), the heating layer 258 has a thin thickness and the routing layer 256 has a thick thickness.

The support pedestal 10 of the present disclosure has the advantages of making all functional layers in green state and combining all functional layers in a hot press process. Some of the layers may be in a sintered state and are bonded by diffusion bonding. Therefore, the support member 12, 120 may be a hybrid of green state and sintered bond. Dual damascene thin film process may be used to form the resistive layer 24, 124, 252 and the routing layer 28, 128, 256. The resistive layer 24, 124, 252 and the routing layer 28, 128, 256 are provided on different planes and the conductive vias 32, 132 and the electrical terminals 34, 142 are used to connect the resistive layer 24, 124, 252 and the routing layer 28, 128, 256 to the electric cables 20 and then to an external power source, thereby simplifying the connection of the resistive layer 24, 124, 252 to the electric cables 20 in the tubular shaft 14. With the simplified terminal connection, more heating circuits can be formed, and thus more heating zones may be provided in the support member 12, 120 without being limited by the connection of the heating circuit to the electric cables 20.

While the support pedestal 10 has been described to be used for semiconductor processing, it should be understood that the support pedestal 10 may be modified so that only the support member 12 without the tubular shaft 14 is used to form a heater for a general heating purpose.

While not shown in the drawings, it is understood that other structures may be integrated in the support pedestal 10, such as electrostatic chuck, cooling channels, RF antennas, and electronics/solid state devices.

It should be noted that the disclosure is not limited to the various forms described and illustrated as examples. A large variety of modifications have been described and more are part of the knowledge of the person skilled in the art. These and further modifications as well as any replacement by technical equivalents may be added to the description and figures, without leaving the scope of the protection of the disclosure and of the present patent.

What is claimed is:

1. A support pedestal comprising:
   a support member including a resistive layer having at least two zones, a routing layer, and a plurality of conductive vias, the resistive layer including a plurality of resistive heating elements that define the at least two zones and that are not directly connected,
   wherein the resistive layer and the routing layer are disposed in different planes of the support member and are connected by the plurality of vias, and
   wherein the plurality of resistive heating elements are connected by a plurality of wires such that the number of zones of the resistive layer is greater than or equal to a number of the plurality of wires coupled to the routing layer.

2. The support pedestal according to claim 1, wherein the resistive layer and the routing layer are disposed in a plane normal to the support member and overlap such that the resistive layer extends across a central region of the support member.

3. The support pedestal according to claim 1, wherein the support member includes a main substrate having opposing surfaces, the resistive layer and the routing layer being disposed on the opposing surfaces of the main substrate, and the plurality of conductive vias extending through the main substrate.

4. The support pedestal according to claim 3, wherein the plurality of conductive vias are perpendicular to the opposing surfaces.

5. The support pedestal according to claim 1, wherein the plurality of resistive heating elements define a plurality of heating zones, the routing layer including a central portion and a plurality of arm portions extending from the central portion and electrically connected to the heating zones, the number of arm portions corresponding to the number of the resistive heating elements.

6. The support pedestal according to claim 5, wherein the support member further comprising a plurality of electric terminals connected to the central portion of the routing layer.

7. The support pedestal according to claim 1, wherein the support member includes a main substrate defining a top surface and a bottom surface, the main substrate defining a plurality of apertures for receiving the conductive vias therein, and a plurality of blind recesses open to the bottom surface.

8. The support pedestal according to claim 7, wherein the plurality of conductive vias extend from the top surface to the bottom surface of the main substrate and are flush with the top and bottom surfaces of the main substrate.

9. The support pedestal according to claim 7 further comprising a plurality of electric terminals disposed within the blind recesses.

10. The support pedestal according to claim 9, wherein the routing layer includes a plurality of arm portions each having one end connected to a pair of the plurality of conductive vias and another end connected to a pair of the plurality of electric terminals.

11. The support pedestal according to claim 9, wherein at least a portion of the plurality of electric terminals are flush with the bottom surface of the main substrate.

12. The support pedestal according to claim 1, wherein the support member further includes a top layer, a main substrate, and a bottom layer, wherein the resistive layer is disposed between the top layer and the main substrate, and the routing layer is disposed between the main substrate and the bottom layer.

13. The support pedestal according to claim 1 further comprising a second resistive layer disposed along the same plane as the routing layer.

14. The support pedestal according to claim 13, wherein the routing layer has a higher resistance than that of the second resistive layer and overlaps a portion of the second resistive layer.

15. The support pedestal according to claim 13, wherein the routing layer has a higher resistance than that of the second resistive layer and abuts the second resistive layer.

16. The support pedestal according to claim 13 further comprising a transition trace disposed along the same plane as the second resistive layer and the routing layer, wherein a resistance of the transition trace is less than or equal to a resistance of the second resistive layer.

17. The support pedestal according to claim 1, wherein the resistive layer has one or more of a two-wire heater configuration, a matrix wiring configuration for connecting the resistive layer to an external power source, and a multi-parallel wiring configuration for connecting the resistive layer to an external power source.

18. A support pedestal comprising:
- a plurality of resistive heating elements defining a plurality of heating zones;
- a routing layer including a central portion and a plurality of arm portions extending from the central portion;
- a main substrate disposed between the plurality of resistive heating elements and the routing layer; and
- a plurality of pairs of conductive vias extending through the main substrate and connected to the plurality of resistive heating elements, wherein each arm of the plurality of arm portions is connected to a corresponding pair of the conductive vias, wherein the number of heating zones is greater than or equal to a number of wires coupled to the routing layer.

19. The support pedestal according to claim 18 further comprising a control system including a plurality of power converters for adjusting power to the heating elements of the resistive layer.

20. A support pedestal comprising:
- a substrate having a first surface and a second surface;
- a first resistive layer having at least two zones and disposed on the first surface of the substrate;
- a second resistive layer having at least two zones and disposed on the second surface of the substrate;
- a routing layer disposed on the same plane as the second resistive layer; and
- a plurality of conductive vias adapted to electrically couple the routing layer to the first resistive layer;

wherein at least one of the first and second resistive layers include a plurality of resistive heating elements that define the at least two zones, that are not directly connected, and that are connected by a plurality of wires such that the number of zones of the at least one of the first resistive layer and the second resistive layers is greater than or equal to a number of the plurality of wires coupled to the routing layer.

* * * * *